United States Patent
Hong et al.

[11] Patent Number: 5,985,763
[45] Date of Patent: Nov. 16, 1999

[54] METHOD FOR PRODUCING BARRIER-LESS PLUG STRUCTURES

[75] Inventors: Qi-Zhong Hong; Wei-Yung Hsu, both of Dallas; Shin-puu Jeng, Plano, all of Tex.

[73] Assignee: Texas Instruments Incorporated, Dallas, Tex.

[21] Appl. No.: 08/970,961

[22] Filed: Nov. 14, 1997

Related U.S. Application Data

[63] Continuation of application No. 08/455,437, May 31, 1995, abandoned.

[51] Int. Cl.$^6$ ................................................. H01L 21/441
[52] U.S. Cl. ........................ 438/688; 438/637; 438/644; 438/636
[58] Field of Search .................... 438/688, 644, 438/637, 636, 675

[56] References Cited

U.S. PATENT DOCUMENTS

| | | | |
|---|---|---|---|
| 5,011,793 | 4/1991 | Obinata | 437/203 |
| 5,108,951 | 4/1992 | Chen et al. | 437/187 |
| 5,234,864 | 8/1993 | Kim et al. | 437/197 |
| 5,281,850 | 1/1994 | Kanamori | 257/758 |
| 5,360,995 | 11/1994 | Graas | 257/751 |
| 5,420,072 | 5/1995 | Fiordalice et al. | 437/192 |
| 5,486,492 | 1/1996 | Yamamoto et al. | |
| 5,498,572 | 3/1996 | Shiga et al. | 437/190 |
| 5,506,177 | 4/1996 | Kishimoto et al. | 437/195 |
| 5,543,357 | 8/1996 | Yamada et al. | |
| 5,693,564 | 12/1997 | Yu | |
| 5,804,251 | 9/1998 | Yu et al. | |

FOREIGN PATENT DOCUMENTS

| | | | |
|---|---|---|---|
| 0 516 344 A1 | 5/1992 | France. | |
| 4210821 | 10/1992 | Germany | H01L 23/522 |
| 2260653 | 4/1993 | United Kingdom | H02G 3/04 |

OTHER PUBLICATIONS

N. Takeyasu et al., "Characterization of Direct–Contact Via Plug Formed by Using Selective Aluminum Chemical Vapor Depostion"; The International Conference on Solid State Devices and Materials, Aug. 29, 1993; pp. 180–182.

T. Kaizuka, et al., "Conformal Chemical Vapor Deposition TiN (111) Film Formation as an Underlayer of Al for Highly Reliable Interconnects"; The International Conference on Solid State Devices and Materials, Aug. 29, 1993; pp. 555–557.

Dixit et al., "A Novel High Pressure Low Temperature Aluminum Plug Technology for Sub–0.5$\mu$m Contact/Via Geometris", International Electron Devices Meeting, San Francisco, Ca., Dec. 11–14, 1994, pp. 105–108.

Peter Burggraaf, "Straightening Out Sputter Deposition" *Semiconductor International*, Aug. 1995, pp. 69–70 and pp. 72–74.

Dixit, et al., "Application of High Pressure Extruded Aluminum to ULSI Metallization", *Semiconductor International*, Aug. 1995, pp. 79–80 and 82, 84–85.

*Primary Examiner*—Caridad Everhart
*Attorney, Agent, or Firm*—April M. Mosby; W. James Brady; Richard L. Donaldson

[57] ABSTRACT

Methods are provided for the construction of metal-to-metal connections between non-adjacent layers in a structure, such as a semiconductor device. A first metal conductor layer is provided along a substrate. An anti-reflection cap is provided in overlying relation with said first conductor layer. At least a portion of the dielectric layer and the anti-reflection cap is removed to define a passage which extends from an upper surface of the dielectric layer to the first metal conductor. The passage is substantially filled with a fill metal, and a second metal conductor layer is applied over at least a portion of the dielectric layer and the substantially filled passage to electrically connect the first and second metal conductors. A diffusion liner can optionally be applied to the passage prior to application of the fill metal. The passage fill metal and second conductor layer can be integrally formed, and the fill metal and at least one of the conductor layers are formed from the same matrix metal.

18 Claims, 2 Drawing Sheets

METHOD FOR PRODUCING BARRIER-LESS PLUG STRUCTURES

This application is a Continuation, of application Ser. No. 08/455,437 filed on May 31, 1995 of Oi-Zhong Hong, et al. for Method for Producing Barrier-Less Plug Structures now abandoned.

TECHNICAL FIELD OF THE INVENTION

This invention relates to manufacturing processes, and more particularly to processes for cavity filling between adjacent surfaces or levels of a structure so as to make electrical connections between the adjacent surfaces or levels. The invention has particular utility in the construction of electrical connections between adjacent levels of semiconductor devices.

BACKGROUND OF THE INVENTION

Many obstacles exist to further miniaturization of semiconductor components. Among these obstacles include the filling of metal interconnect layers to insure proper operation of the devices. Metal interconnect signal lines establish contact with lower conductive layers of the integrated circuit through vias that are formed in an insulating layer. It is desirable to completely fill the via with the metal that is used to form the interconnect layer so as to ensure optimal operation of the device.

For reasons of its cost, physical properties and availability, aluminum is presently the metal of choice for the fabrication of metal interconnect lines in integrated circuits. The interconnect lines are typically formed by a sputtering process, which can result in less than optimal filling of the contact vias. For example, problems can arise from the accumulation of relatively large amounts of aluminum at the upper surface of the insulating layer. The accumulation of such quantities of aluminum at the edges of the contact via can block or otherwise obstruct the via prior to the delivery of aluminum in sufficient quantity to completely fill the via, resulting in the formation of voids and uneven structures within the via. This problem is particularly acute as integrated circuits are fabricated using smaller geometries.

Finer dimensioned contacts that are to be used in smaller geometry devices, such as future generations of sub-0.5 $\mu$m scaled technologies, necessarily will be provided with a larger aspect ratio (i.e., relationship of height to width) than do larger geometry devices, thereby exacerbating the via filling difficulties described above. For example, unduly large voids can result in contact resistance that is appreciably higher than designed. In addition, thinner regions of the aluminum layer adjacent to the via fill region will be subject to electromigration, which can result in the eventual opening of the circuits and failure of the device.

Current tungsten via processing begins with via opening by reactive ion etching (RIE) of an inter-level dielectric (ILD) deposited on appropriately patterned metal leads, such as TiN/Al-Cu/TiN multi-level leads. This is followed by deposition of a Ti/TiN adhesion layer/diffusion barrier, and finally deposition of the tungsten plug. Direct contact of the tungsten plug with the top or bottom aluminum lead can be detrimental to via resistance and electromigration reliability. One theory as to the cause of these problems is possible interaction of aluminum and tungsten, during which the imbalance between aluminum flux and tungsten flux promotes formation of Kirkendal voids. Therefore, it is required that the RIE not attack the TiN cap on Al leads, and that another TiN diffusion barrier be used before tungsten plug deposition to further isolate the aluminum from the tungsten. The drawback of the use of a diffusion barrier in the via is that it blocks diffusion of aluminum and copper at an atomic level from the top metal lead to the bottom lead. As a consequence, there arises a large flux divergence at the via bottom/Al—Cu interface, and therefore poor electromigration performance.

Recent advancements in plug processing indicate that the tungsten plug can be replaced by an aluminum or copper plug deposited by either high temperature/high pressure sputtering or chemical vapor deposition (CVD). Due to their much lower resistance, the deposited aluminum or copper can be used simultaneously as both plugs in vias and conducting leads on the inter-level dielectric field. This eliminates the need of plug etch-back processing, thereby increasing product throughput and yield.

Nevertheless, present aluminum plug processes, which utilize high temperature reflow, high pressure force fill, or CVD, are similar to the tungsten process in that the TiN cap remains intact during reactive ion etch, and a Ti/TiN layer is used as a reflow liner/nucleation seed. Experimental results show the electrical resistance of a 0.45 $\mu$m aluminum via to be about 1.2 ohm compared to the approximately 2.2 ohm resistance for a tungsten plug. However, the non-uniformity of the via resistance for the aluminum plug is quite large. In addition, via electromigration tests on aluminum plugs reveal little improvement in lifetime over tungsten plug technology. Accordingly, it would be desirable to develop aluminum and copper plug technology having improved via resistance uniformity and improved electromigration performance over that available in the prior art to more fully utilize the diminished electrical resistance characteristics of aluminum and copper via fill.

BRIEF DESCRIPTION OF THE DRAWINGS

The foregoing and other advantages of the present invention will become apparent from a reading of the following specification in conjunction with the accompanying drawings, in which.

DETAILED DESCRIPTION OF THE PREFERRED EMBODIMENT

Figure 1:
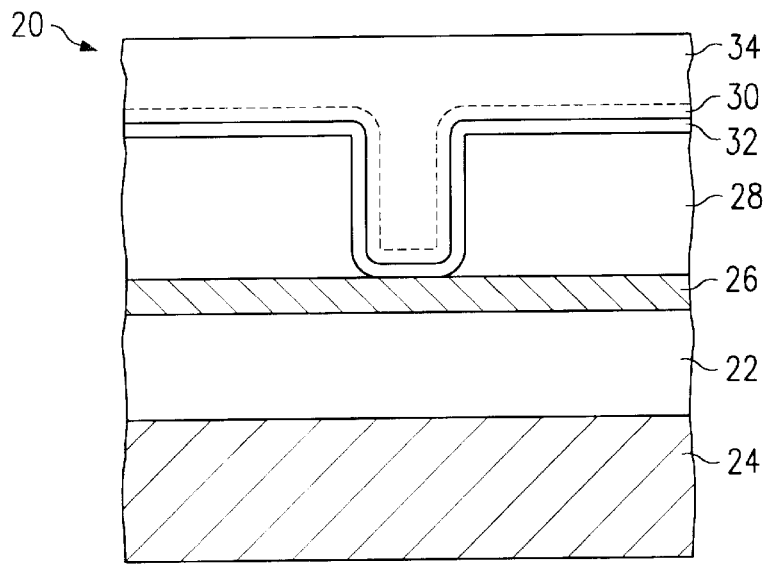
FIG. 1 is a cross-section of prior art tungsten filled via structures.

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

In view of the foregoing deficiencies and design considerations, novel aluminum and copper via structures are provided which afford improved electrical performance and reliability over known via structures, particularly those fabricated from tungsten. As will be described in detail below, the via structures of the present invention provide for the elimination of the anti-reflection cap and diffusion barrier that are typically deposited at the via bottom, and instead provides a diffusion liner that facilitates subsequent deposition of the aluminum or copper plug. Moreover, unlike the diffusion barrier of the prior art, the diffusion liner of the present invention is formulated so as not to inhibit diffusion of metal atoms across the liner.

With reference to the drawings, wherein like reference characters represent corresponding parts throughout the various views, and with particular reference to FIG. 1, there is depicted for illustrative purposes a known aluminum-filled via structure, denoted generally by reference numeral 20. The structure 20 includes a lower level conductor 22 that is typically formed of an electrically conductive metal alloy, such as Aluminum—Copper(0.5%). The conductor 22 is applied over an underlying layer 24 of an insulative or dielectric material, such as tetraethyloxysilane ("TEOS"). An anti-reflection cap ("ARC") layer 26, typically formed from TiN, is deposited by sputtering prior to patterning and is provided to minimize the incidence of reflection during photolithography, thus allowing for smaller geometry patterning. Anti-reflection caps can comprise alloys of titanium and tantalum, such as TiW, TiN, TiWN, TaN, TaSiN, and less frequently, tantalum and titanium. Titanium-tungsten and TiN are preferred for use as such caps 26, as these materials are more resistant to oxidation than is pure titanium. However, thin oxide surface layers can develop when the TiW and TiN are exposed to air, thus increasing electrical resistance. Further complications can arise from the formation of aluminum nitride at the TiN anti-reflection cap and lower aluminum lead interface. The development of titanium oxide and aluminum nitride interfacial layers are typically non-conductive and non-reproducible. As a consequence, implementation of design accommodations for the foregoing interfacial layers cannot be readily implemented. Accordingly, it would be desirable to remove the anti-reflection cap 26, as its removal would result also in the removal of the two interfacial layers, thus promoting fabrication of electrical contacts having low contact resistance and tight distribution.

A layer 28 of a suitable dielectric, such as $SiO_2$, is patterned and applied over the anti-reflection cap 26. A via 30 is reactive ion etched or otherwise formed in the dielectric layer 28, and lined with a diffusion barrier 32 comprised of a TiN film overlying a film of titanium. The diffusion barrier 32 is applied by chemical vapor deposition ("CVD") or physical vapor deposition ("PVD") to enhance tungsten nucleation and, more importantly, to block contact reactions between aluminum and tungsten. Following deposition of the liner 32, the via 30 is filled with an appropriate fill material or plug 34, such as tungsten, applied by chemical vapor deposition.

For the newer generation of aluminum plug processes, as will be explained in greater detail below in conjunction with the present invention, a liner layer is still desirable to provide nucleation cites for chemical vapor deposition ("CVD") or interfacial wetting for reflow. However, the liner for aluminum plug processing need not be formulated as a diffusion barrier at the via bottom, since both the plug and the conductor are preferably formed from the same matrix metal, although not necessarily in the same alloy formulation. As used herein, the term "matrix metal" relates to the principal metal comprising a metal alloy. Moreover, the absence of a diffusion barrier at the via bottom, as provided in the present invention, promotes atomic interdiffusion between the plug and the conductor, thus further reducing the via resistance and flux divergence.

In accordance with the teachings of the present invention, an anti-reflection cap 26 interposed between the via and the lower level conductor 22 can be removed prior to via filling by physical or chemical etching, preferably by anisotropic reactive ion etching ("RIE"). Additional dry clean/etch of exposed conductor may also be performed. The reactive ion etch can be conducted ex-situ in a stand-alone etch chamber, or may alternatively be conducted in-situ in a cluster tool having an RIE etch chamber and a plug deposition chamber. Preferably, the plug deposition chamber is operable to conduct low temperature (below about 400° C.), high pressure (300–1,200 atm.) extrusion fill of the type disclosed in U.S. patent application Ser. No. 08/447,490 of W. Hsu and Q. Hong, entitled "Multi-Stage Semiconductor Cavity Filling Process" filed on May 23, 1995, now abandoned. [TI-20792]; or U.S. patent application Ser. No. 08/354,590 of G. Dixit and R. Havemann, entitled "High Pressure, Low Temperature Semiconductor Cavity Filling Process" filed on Dec. 12, 1994, now abondoned the respective disclosures of both of the foregoing patent applications being incorporated herein by reference and assigned to Texas Instruments, Inc., the assignee herein.

Figure 2A:
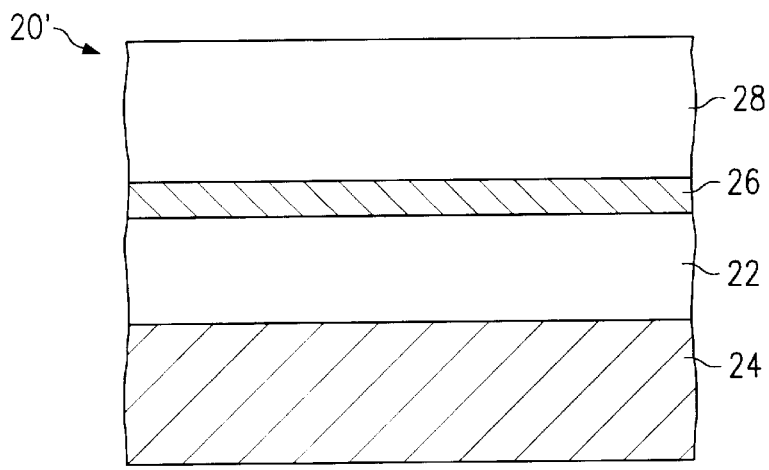
FIGS. 2A–2D are cross-sectional sequential illustrations of via fill in accordance with the present invention.
Figure 2B:
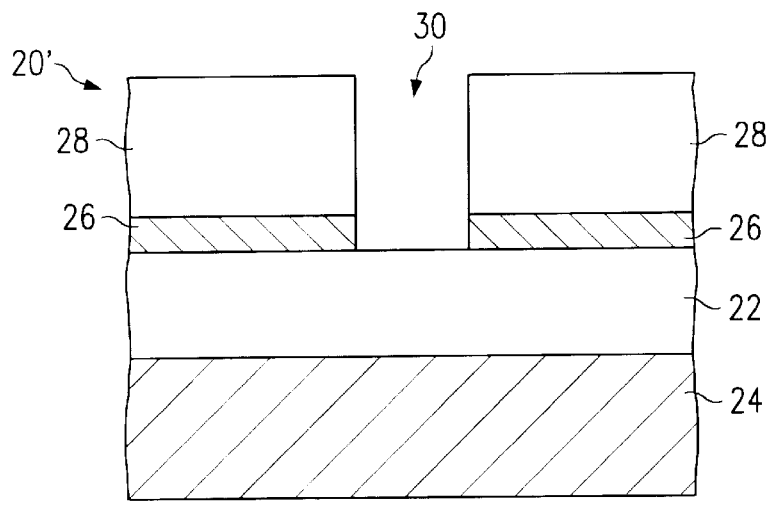
Figure 2C:
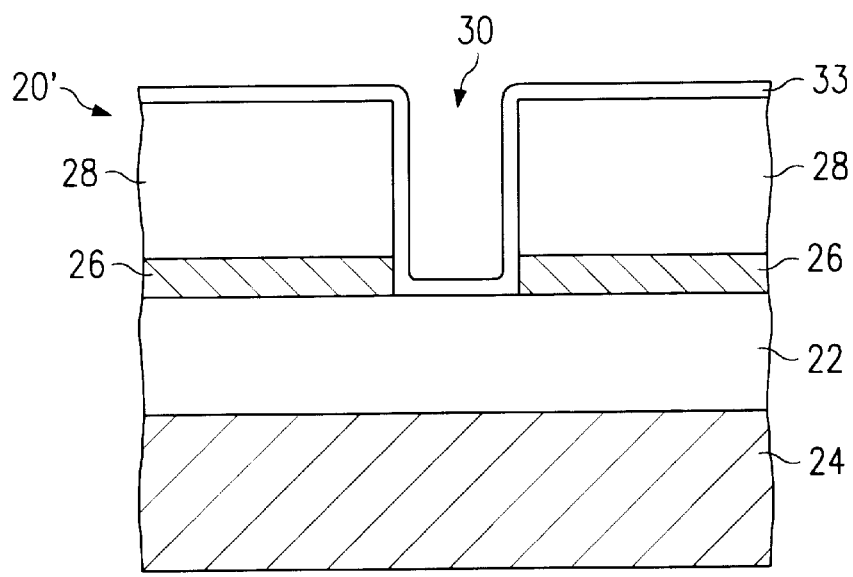
Figure 2D:
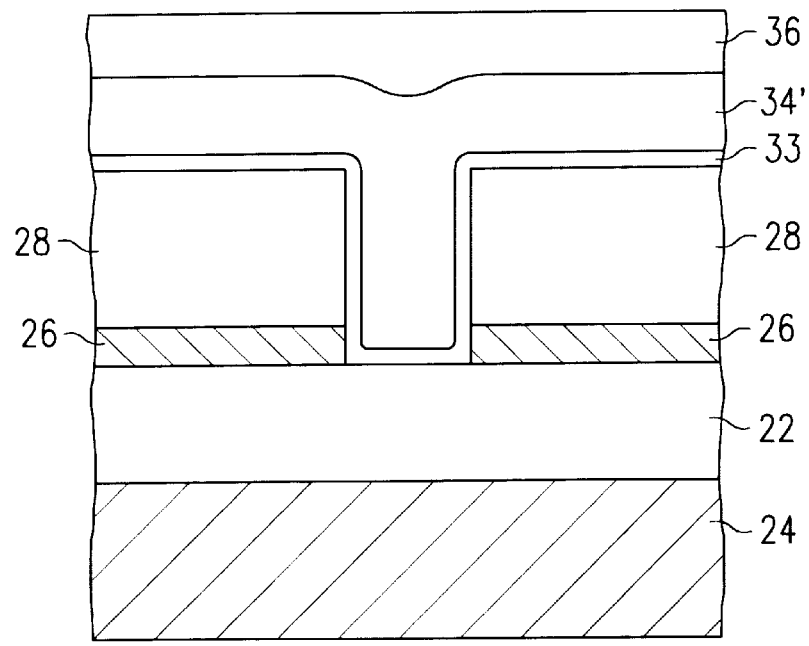

With reference to FIGS. 2A–2D, there are depicted the process steps for construction of a barrier-less plug structure of the present invention. With particular reference to FIG. 2A, there is depicted a semiconductor device under construction, designated generally by reference numeral 20'. The device 20' at this stage of construction includes a layer 24 of dielectric material such as tetraethyloxysilane ("TEOS") or boron phosphate silicate glass ("BPSG") plasma enhanced TEOS which supports a conductive metal layer 22 formed from a suitable metal, such as aluminum—copper(0.5%). However, it is to be appreciated that other suitable metals, such as metals selected from the group consisting essentially of one or more of the following compositions: (1) Al—Cu($~0-~4\%$); (2) Al—Ge($~0-~5\%$)—Cu($~0-~4\%$); (3) Al—Sc($~0.1-~0.3\%$); (4) Al —Si ($~0-~1\%$)—Cu($~0-~4\%$); (5) Al—Si($~0-~1\%$)—Sc ($~0-~0.3\%$); and (6) Cu—Ti(x), Cu—Al(x), and Cu—Mg (x), where $~0.1\% <x<~1\%$ for each of the foregoing copper alloys; the foregoing compositions taken singularly or in combination with one another, can also be used for the metal layer 22.

The metal layer 22 can be applied by sputtering at a temperature of about 300° C. An anti-reflection coating or cap 26 having the chemical composition identified above can be sputter deposited over the metal 22. Such anti-reflection coatings are typically formed from TiN and are deposited by sputtering to a thickness of about 50 nm. A dielectric 28 is provided in overlying relation with the anti-reflection coating 26 at a thickness of up to about 2,000 nm. The dielectric layer can be applied by plasma enhanced chemical vapor deposition ("PECVD") or as a spin-on-glass.

A via 30 (FIG. 2B) of approximately 0.25–0.50 $\mu$m width and $~1$ $\mu$m depth is opened in the dielectric layer 28 by an appropriate process, such as reactive ion etching ("RIE"). The etching process creates an opening 30 that extends from an upper surface of the dielectric 28, through the dielectric layer 28, and (optionally) through the anti-reflection coat 26, to the upper surface of the metal conductor 24. Alternatively, the anti-reflection coat 26 underlying the via 30 can be etched away in a separate process. Appropriate etchants are selected to avoid etching of the underlying metal layer 24, as is known in the art. Supplemental dry cleaning and/or etching of the exposed conductor 24 can optionally be provided. The reactive ion etch can be performed ex-situ in a stand-alone etch chamber, or can be performed in-situ in a cluster-type tool having an RIE chamber.

In contrast to prior art plug fill practices, which provide for the application of a diffusion barrier 32 (FIG. 1) to the via structure to inhibit interdiffusion between metal layers on opposite sides of the barrier, the via 30 constructed in accordance with the present invention is provided with a diffusion liner 33 (FIG. 2C) having a thickness of up to about 100 nm to facilitate via fill and permit metal atom interdiffusion across the liner 33. The diffusion liner 33 can be formed, by way of example, from titanium, copper, aluminum, aluminum-copper(~0–~4%), $Ti_x$—$Si_{1-x}$ (0≦x≦1), $W_xSi_{1-x}$ (0≦x≦1), and other metals that do not significantly reduce interdiffusion between metal layers interconnected by the via 30. Suitable deposition processes for the diffusion liner 33 include physical sputtering and chemical vapor deposition. The diffusion liner 33 permits interdiffusion of conductor/plug atoms, dopant/solute atoms in the conductor and/or plug at temperatures in the range of ~80°–~450° C. and/or under the influence of electric fields having field strengths of about $10^5$–$10^7$ amp-cm$^2$. The diffusion liner 33 can also serve as a conductor/plug dopant source for, e.g., copper or titanium, so as to improve conductor electromigration resistance. Moreover, the liner 33 can provide a seed for modifying the crystalline orientation of the conductor.

A fill layer or plug 34' (FIG. 2D) formed from a metal conductor is applied to the via 30 to fill the via and provide for an electrical connection between an underlying conductor layer, such as layer 22, and an overlying conductor layer 36, as is well known in the art. While the fill layer/plug 34' can be applied as a discrete member, separate from the overlying second conductor layer 36, the fill layer/plug 34' can be applied as a thickened layer which extends beyond the passage opening to form an integral plug-second conductor layer. One or both of the metal conductor layers 22 & 36 and integral fill layer/plug-second conductor layer of the present invention can be applied at a thickness of about 100–1,200 nm.

While a variety of plug fill processes can be utilized in conjunction with the present invention, preferred plug fill practices are the low temperature, high pressure extrusion practices disclosed in co-pending U.S. patent application Ser. Nos. 08/447,490 [TI-20792] and 08/354,590 discussed above, the disclosures of which are hereby incorporated by reference. Optionally, the plug 34' can be applied by chemical vapor deposition. Either one or both of the conductor layers 22 & 36 and fill layer/plug 34'can be applied by physical sputtering at temperatures of about 200°–600° C., optionally followed by high pressure annealing at pressures of about 300–1,200 atm. at temperatures of about 200°–600° C. However, in instances where relatively low dielectric constant K dielectric materials, such as parylene, PTFE compounds, xerogels and aerogels are used, it is preferred to maintain metal deposition and fill temperatures below about 400° C. in order to avoid decomposition of the dielectrics. Alternatively, one or both of the conductor layers 22 & 36 can be applied by chemical vapor deposition, electroplating, or electroless plating. Preferred materials for the fill layer/plug 34' and either one or both of the conductor layers 22 & 36 include: (1) Al—Cu(~0–~4%); (2) Al—Ge(~0–~5%)—Cu(~0–~4%); (3) Al—Sc(~0.1–~0.3%); (4) Al—Si(~0–~1%)—Cu(~0–~4%); (5) Al—Si(~0–~1%)—Sc(~0–~0.3%); and (6) Cu—Ti(x), Cu—Al(x), and Cu—Mg(x), where ~0.1% <x <~1% for each of the foregoing copper alloys; the foregoing compositions taken singularly or in combination with one another. The conductor layers 22 & 36 can be formed as blanket films or as discrete zones or lines having a width of about 100–1,000 nm. In either case, the conductor layers can be applied at a thickness of about 100–1,400 nm.

Our preliminary experiment results have rendered via resistance reductions for aluminum-filled vias that are filled in the high pressure, low temperature extrusion processes disclosed in co-pending U.S. patent application Ser. Nos. 08/447,490 [TI-20792] and 08/354,590 discussed above, from about 1.2 ohm to about 0.75 ohm upon removal of the anti-reflection cap liner 26. For such wafers having their TiN anti-reflection caps removed and being provided with a diffusion liner 33 in accordance with the teachings of the present invention, the via resistance decreases further to about 0.45–0.55 ohm. The non-uniformity also improves from 30–43% to as low as 11%.

Although the present invention and its advantages have been described in connection with the preferred embodiments, it should be understood that various changes, substitutions and alterations can be made herein without departing from the spirit and scope of the invention as defined by the appended claims.

What is claimed is:

1. A method of forming a metal-to-metal connection between non-adjacent layers in a structure, comprising the steps of:
   (a) providing a substrate having a first metal conductor layer;
   (b) applying an anti-reflection cap layer over said first conductor layer;
   (c) applying a dielectric layer in overlying relation with said anti-reflection cap layer;
   (d) removing at least a portion of said dielectric layer and said anti-reflection cap layer to define a passage which extends from an upper surface of the dielectric layer to the first metal conductor layer;
   (e) applying a diffusion-facilitating liner along at least a portion of said passage, said diffusion-facilitating liner contacting said dielectric layer and said anti-reflection cap layer and overlying at least a portion of said first metal conductor layer, wherein said diffusion-facilitating liner is formed from a material selected from a group consisting essentially of copper, aluminum, Al—Cu, $Al_x$—$Ti_{1-x}$, $Ti_x$—$Si_{1-x}$ and $W_xSi_{1-x}$, where 0≦x≦1;
   (f) depositing a fill metal in overlying relation with said diffusion-facilitating liner; and
   (g) applying a second metal conductor layer over at least a portion of said fill metal to establish an electrical connection between said first and second metal conductor layers.

2. The method according to claim 1, wherein said diffusion liner is provided at a thickness of up to about 100 nm.

3. The method according to claim 1, wherein said diffusion liner is applied by one of physical sputtering or chemical vapor deposition.

4. The method according to claim 1, wherein at least two of said first and second conductor layers and said passage fill metal are formed from the same matrix metal.

5. The method of claim 1, wherein at least one of said fill metal and said first and second conductor layers is formed from a material selected from the group consisting essentially of (1) Al—Cu; (2) Al—Ge—Cu; (3) Al—Sc; (4) Al—Si—Cu; (5) Al—Si—Sc; and (6) Cu—Ti(x), Cu—Al(x), and Cu—Mg(x), where ~0.1%≦x≦~1% for each of the foregoing copper alloys; to foregoing compositions taken singularly or in combination with one another.

6. The method of claim 1, wherein at least one of said fill metal and said first and second conductors is deposited by at least one of the following processes: physical sputtering, physical sputtering followed by high pressure annealing, chemical vapor deposition, electroplating, or electroless plating.

7. The method of claim 1, wherein the said anti-reflection cap is formed from a material comprising one of titanium or tantalum.

8. The method of claim 1, wherein the said anti-reflective cap is removed by one of physical sputter etching, wet etching, or dry chemical etching.

9. The method of claim 1, wherein said passage is provided with a width of up to about 1 $\mu$m.

10. The method of claim 1, wherein the said dielectric layer is applied at a thickness of up to about 2,000 nm.

11. The method of claim 1, wherein at least one of said first and second conductor layers is formed with a width of about 100–1,200 nm.

12. The method of claim 1, wherein at least one of said first and second conductor layers is formed at a thickness of about 100–1,400 nm.

13. A method of forming a metal-to-metal connection between non-adjacent layers in a structure, comprising the steps of:

(a) providing a first metal conductor layer to a substrate:

(b) applying a patterned anti-reflective coating in overlying relation with a portion of said first metal conductor layer so as to establish a void region substantially free of said anti-reflective coating;

(c) applying a dielectric layer in overlying relation with said anti-reflective coating;

(d) defining a passage which overlies said void region and extends from an upper surface of said dielectric layer to said first metal conductor layer;

(e) applying a diffusion-facilitating liner along at least a portion of said passage in contact with said first metal conductor layer, said patterned anti-reflective coating, and said dielectric layer, wherein said diffusion-facilitating liner is formed from a material selected from a group consisting essentially of copper, aluminum, Al—Cu, $Al_x$—$Ti_{1-x}$, $Ti_x$—$Si_{1-x}$ and $W_x Si_{1-x}$, where $0 \leqq x \leqq 1$;

(f) substantially filling the passage with a fill metal; and (g) applying a second metal conductor layer over at least a portion of said dielectric layer and said substantially filled passage to electrically connect said first and second metal conductors.

14. The method according to claim 13, wherein said second metal conductor layer is formed integrally with said fill metal.

15. The method according to claim 13, wherein at least one of said fill metal and said first and second conductor layers is formed from a material selected from the group consisting essentially of (1) Al—Cu; (2) Al—Ge—Cu; (3) Al—Sc; (4) Al—Si—Cu; (5) Al—Si—Sc; and (6) Cu—Ti (x), Cu—Al(x), and Cu—Mg(x), where ~0.1% $\leqq$ x $\leqq$ ~1% for each of the foregoing copper alloys; to foregoing compositions taken singularly or in combination with one another.

16. The method according to claim 13, wherein at least two of said first and second conductor layers and said passage fill metal are formed from the same matrix metal.

17. The method of claim 1, wherein at least one of said fill metal and said first and second conductor layers is formed from an alloy of copper.

18. The method of claim 13, wherein at least one of said fill metal and said first and second conductor layers is formed from an alloy of copper.

* * * * *